United States Patent [19]

Miyajima

[11] Patent Number: 5,507,910
[45] Date of Patent: Apr. 16, 1996

[54] LEAD FRAME TAPING MACHINE

[75] Inventor: Fumio Miyajima, Togura, Japan

[73] Assignee: Apic Yamada Corporation, Nagano, Japan

[21] Appl. No.: 226,558

[22] Filed: Apr. 12, 1994

[30] Foreign Application Priority Data

Apr. 28, 1993 [JP] Japan .................. 5-102474

[51] Int. Cl.$^6$ .................................. B32B 31/00
[52] U.S. Cl. ................. 156/510; 156/515; 156/518; 156/520; 156/261
[58] Field of Search .................. 156/510, 515, 156/516, 517, 518, 519, 520, 250, 261, 269, 530, 262

[56] References Cited

U.S. PATENT DOCUMENTS

| 4,581,096 | 4/1986 | Sato ................... 156/518 X |
| 4,752,351 | 6/1988 | Lunt ................... 156/261 X |

FOREIGN PATENT DOCUMENTS 60-38825  2/1985  Japan .
4-196576  7/1992  Japan .

*Primary Examiner*—James Engel
*Attorney, Agent, or Firm*—Birch, Stewart, Kolasch & Birch

[57] ABSTRACT

The object of the present invention is to provide a lead frame taping machine, which is capable of waiting the fade at a position away from a lead frame holding section and preventing the punch from shaking when the tape-chip is taped onto the lead frame. The lead frame taping machine of the present invention comprises: a lead frame holding section for holding a lead frame; a die plate for holding a tape to be punched, the die plate being provided away from the lead frame holding section and having a through punch-hole; a punch being provided away from the die plate, the punch being capable of moving to and away from the lead frame holding section through the through punch-hole whereby the punch is capable of punching the tape and pressing a tape-chip, which has punched off from the tape, onto the lead frame; and a driving mechanism for moving the punch. The die plate is capable of moving between a first position which is separate away from the lead frame holding section and a second position which is close thereto, the die plate is moved to the second position when the punch punches off the tape and presses the tape-chip onto the lead frame.

10 Claims, 8 Drawing Sheets

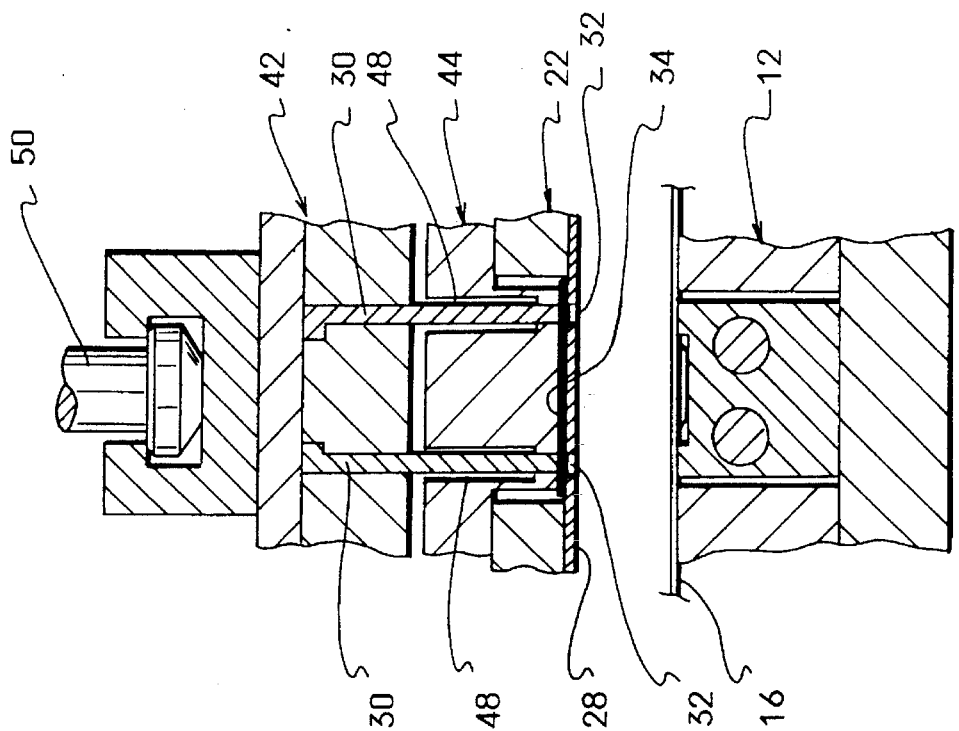
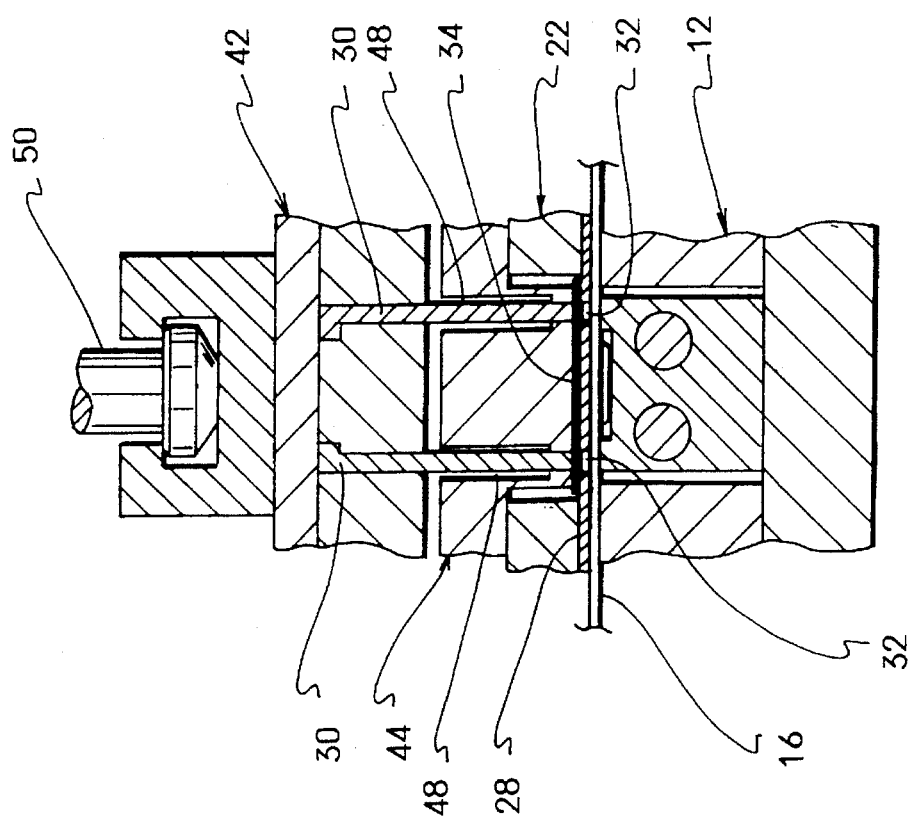

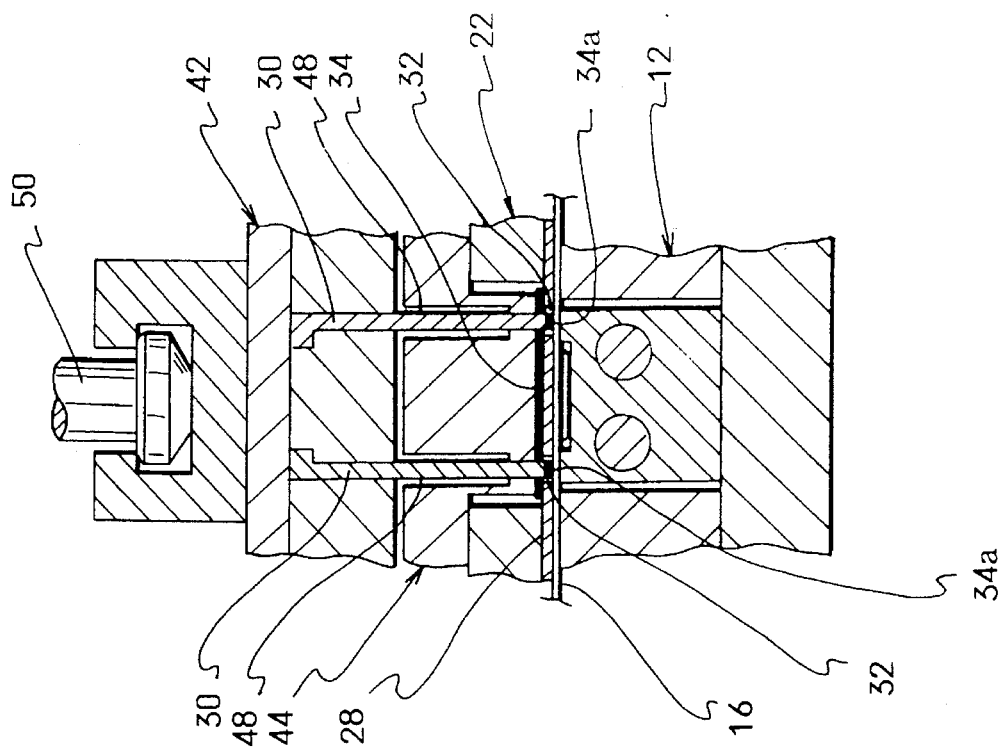
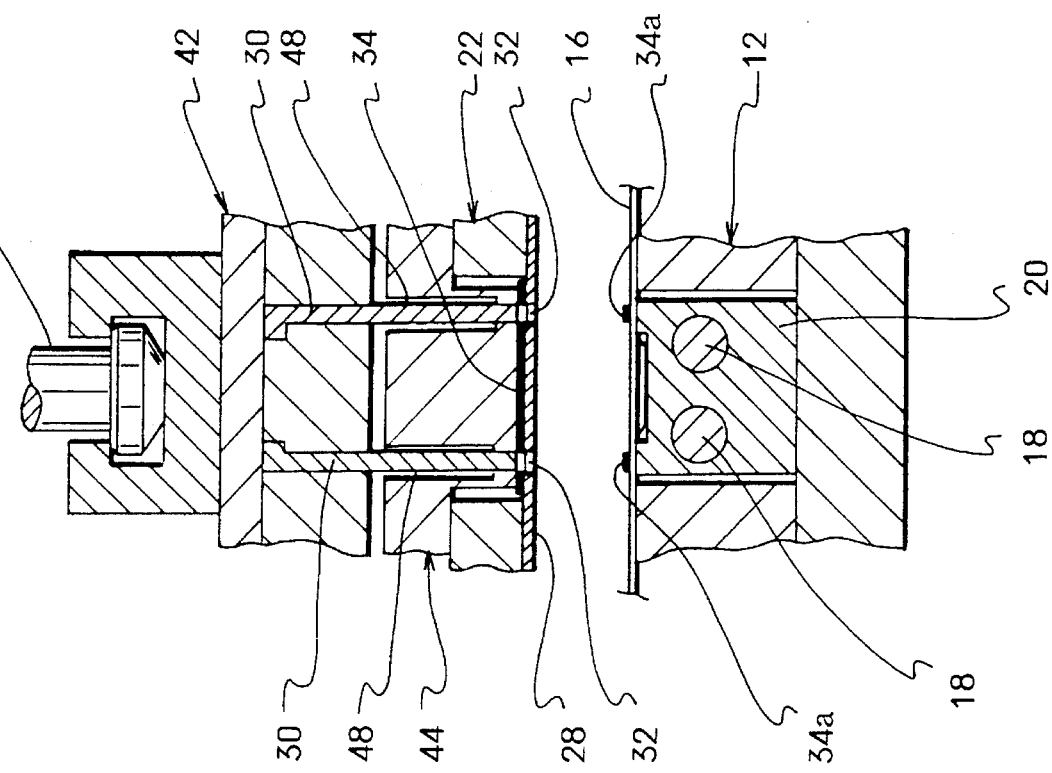

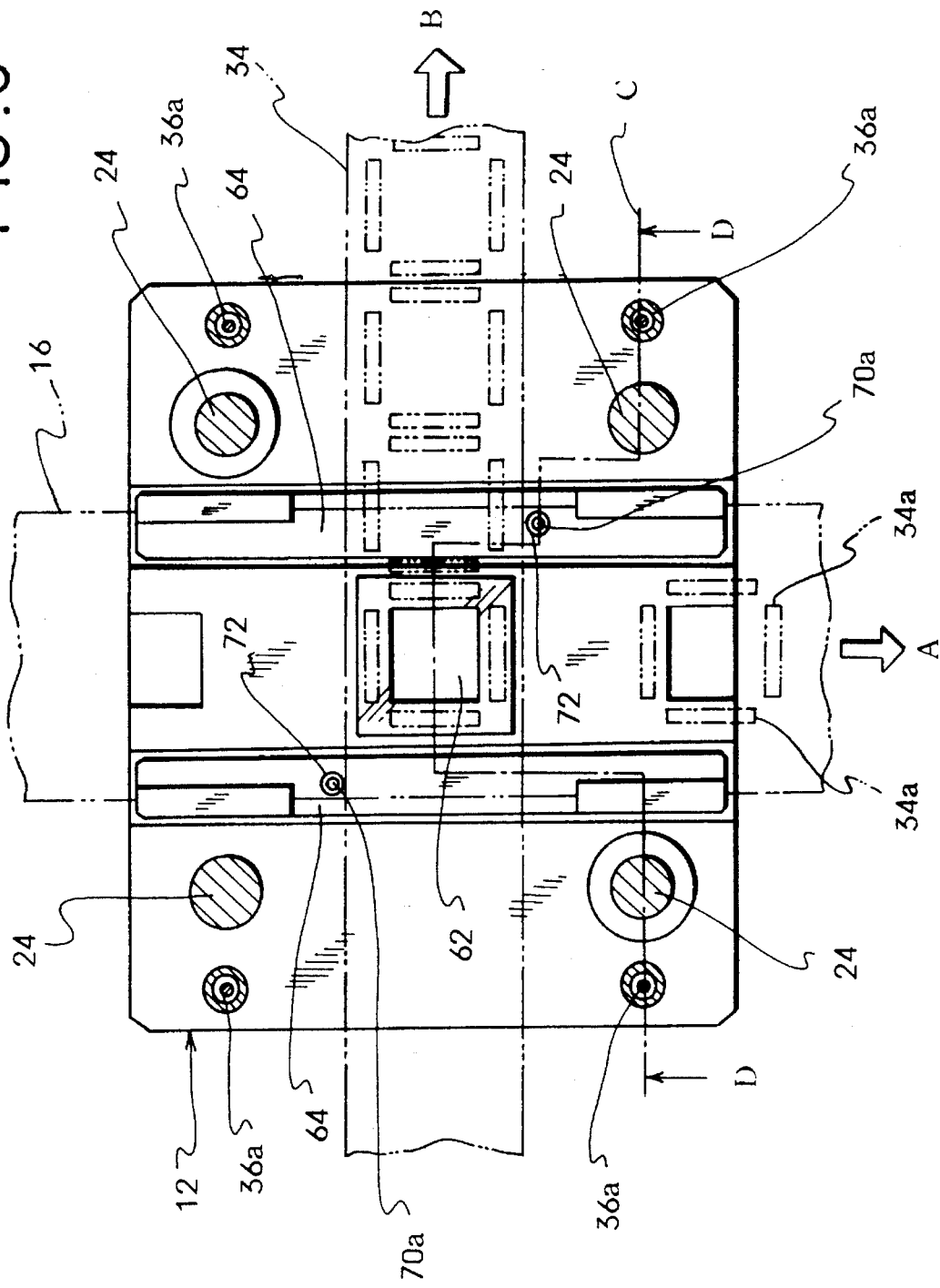

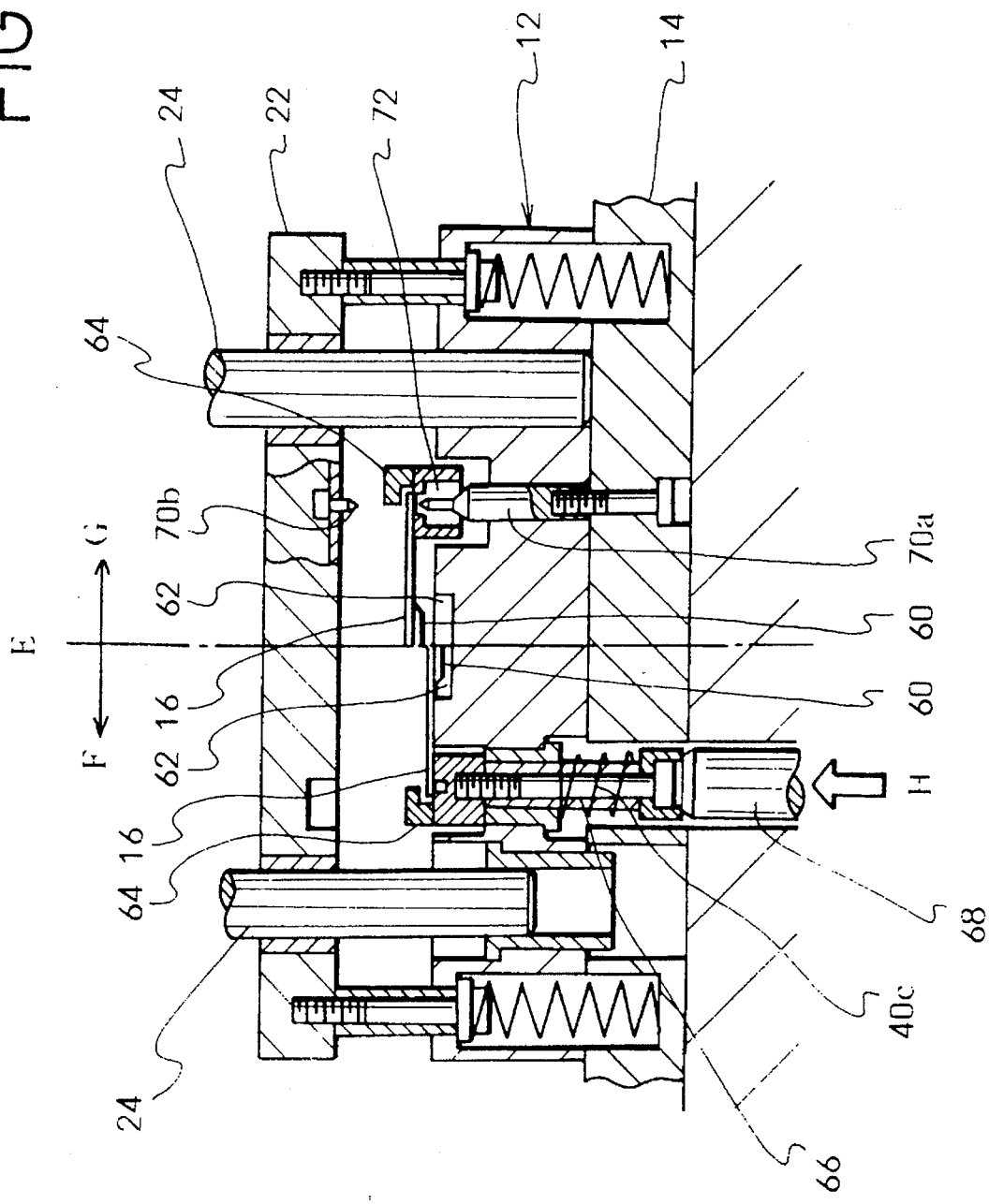

LEAD FRAME TAPING MACHINE

BACKGROUND OF THE INVENTION

1. Field of the Invention

The present invention relates to a lead frame taping machine. More specifically, the invention relates to a lead frame taping machine, which has: a lead frame holding section for holding a lead frame; a die plate for holding a tape to be punched, the die plate being provided away from the lead frame holding section and having a through punch-hole; a punch being provided away from the die plate, the punch being capable of moving to and away from the lead frame holding section through the through punch-hole whereby the punch is capable of punching the tape and pressing a tape-chip, which has punched off from the tape, onto the lead frame; and a driving mechanism for moving the punch.

2. Description of Background Art

A conventional lead frame taping machine will be explained with reference to FIG. 10. The lead frame taping machine 100 is capable of taping inner leads (not shown) of a lead frame 102 for efficient treatment in manufacturing steps.

In the taping machine 100, the lead frame 102 is held on an upper face of a holding section 104. Heaters 108, which hasten the time needed for a tape 106 to adhere, are built in the holding section 104.

A die plate 110 is fixed above the holding section 104. There is vertically bored a punch hole 112 in the die plate 110. The tape 106 is held on an upper face of the die plate 110.

A punch 114 is provided above the die plate 110 and fixed to a punch plate 116, which is capable of vertically moving along guide poles 118. The punch 114 vertically moves together with the punch plate 116. The punch plate 116 with the punch 114 is vertically moved by a vertical driving mechanism 126 having, for example, an electric motor.

An intermediate plate 120 is connected with the punch plate 116 by bolts 122, so that the intermediate plate 120 is capable of vertically moving together with the punch plate 116.

Vertically moving the punch plate 116, the punch 114 passes through a through-hole 124 of the intermediate plate and the punch hole 112 of the die plate 110, so that a lower end of the punch 114 is capable of moving to and away from the lead frame 102 held on the holding section 104. When the punch 114 passes through the punch hole 112, a tape 106, which has been held on the upper face of the die plate 110 and pressed by a bottom face of the intermediate plate 120, is punched, and a tape-chip, which has punched off from the tape 106 by the punch 114, is pressed onto the inner leads of the lead frame 102 to tape.

The tape-chip pressed on the inner leads of the lead frame 102 is heated by the heaters 108 so that the tape-chip can be dried and tightly taped thereon.

However, the conventional taping machine 100 has the following disadvantages.

If the heaters 108 is too close to the tape 106 held on the die plate 110, an adhesive on a bottom face of the tape 106 is excessively melted. Therefore, the tape 106 should be held far above the holding section 104 or the heaters 108, so the die plate 110 is fixed at a position far above the holding section 104.

Since the die plate 110 is fixed at the position far above the holding section 104, excessive softening of the adhesive can be prevented. When the tape-chip is transferred from the die plate 110 to the lead frame 102 by the punch 114, the tape-chip is stuck on a bottom face of the punch 114 by a quite weak adhesive power. In addition, the punch 114 should move a quite long distance with the tape-chip, so that the tape-chip cannot be precisely taped onto the lead frame 102.

Additionally, there are no means for guiding the long movement of the punch 114 between the die plate 110 and the holding section 104, so that the punch 114 shakes. Further, the accuracy of the taping position of the tape-chip is further lowered.

SUMMARY OF THE INVENTION

An object of the present invention is to provide a lead frame taping machine, which is capable of waiting the tape at a position away from a lead frame holding section and preventing the punch from shaking when the tape-chip is taped onto the lead frame.

To achieve the object, the lead frame taping machine of the present invention comprises:

a lead frame holding section for holding a lead frame;

a die plate for holding a tape to be punched, the die plate being provided away from the lead frame holding section and having a through punch-hole;

a punch being provided away from the die plate, the punch being capable of moving to and away from the lead frame holding section through the through punch-hole whereby the punch is capable of punching the tape and pressing a tape-chip, which has been punched off from the tape, onto the lead frame; and a driving mechanism for moving the punch, characterized in that:

the die plate is capable of moving between a first position which is separate away from the lead frame holding section and a second position which is close thereto, the die plate is moved to the second position when the punch punches off the tape and presses the tape-chip onto the lead frame.

In the lead frame taping machine of the present invention, the die plate may be capable of pressing the tape onto the lead frame holding section at the second position. The punch may be attached to a punch plate, which is moved by the driving mechanism, and which presses the die plate toward the lead frame holding section with the movement toward the die plate, and the die plate may be always biased toward the first position by a biasing member, the die plate may move to the second position when the punch plate is moved toward the die plate against the elasticity of the biasing member. The machine may further comprises an intermediate plate being provided away from the die plate, the intermediate plate being moved together with the punch, the intermediate plate pressing the tape onto the die plate when the punch punches off the tape. The intermediate plate may have a guide hole for guiding the movement of the punch, through which the punch passes.

In the lead frame taping machine of the present invention, the die plate is capable of moving to and away from the lead frame holding section. The die plate is located at the first position when no force works. Namely, the die plate locates at a position far from the lead frame holding section prior to punching the tape, so that the tape can be maintained without having any heat applied thereto. Thus, excessive softening of the adhesive of the tape can be prevented.

And when the punch punches the tape and presses the tape-chip onto the lead frame, the die plate is moved to the second position, so that the punch moves toward the lead frame via the through punch-hole of the die plate, which has been close to the lead frame. Thus, the movement of the punch can be guided until its stroke end, and the accuracy of the taping position of the tape-chip can be increased.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Embodiments of the present invention will now be described by way of examples and with reference to the accompanying drawings, in which:

FIG. 2 is a partial front view thereof showing one of the steps of the taping action;

FIG. 3 is a partial front view thereof showing one of the steps of the taping action;

FIG. 4 is a partial front view thereof showing one of the steps of the taping action;

FIG. 5 is a partial front view thereof showing one of the steps of the taping action;

FIG. 6 is a partial plan view of a lead frame holding section showing a lead frame feeding mechanism;

FIG. 7 is a sectional view of the lead frame holding section taken along a line C and in the direction of arrows D shown in FIG. 6;

DETAILED DESCRIPTION OF THE PREFERRED EMBODIMENTS

Figure 1:
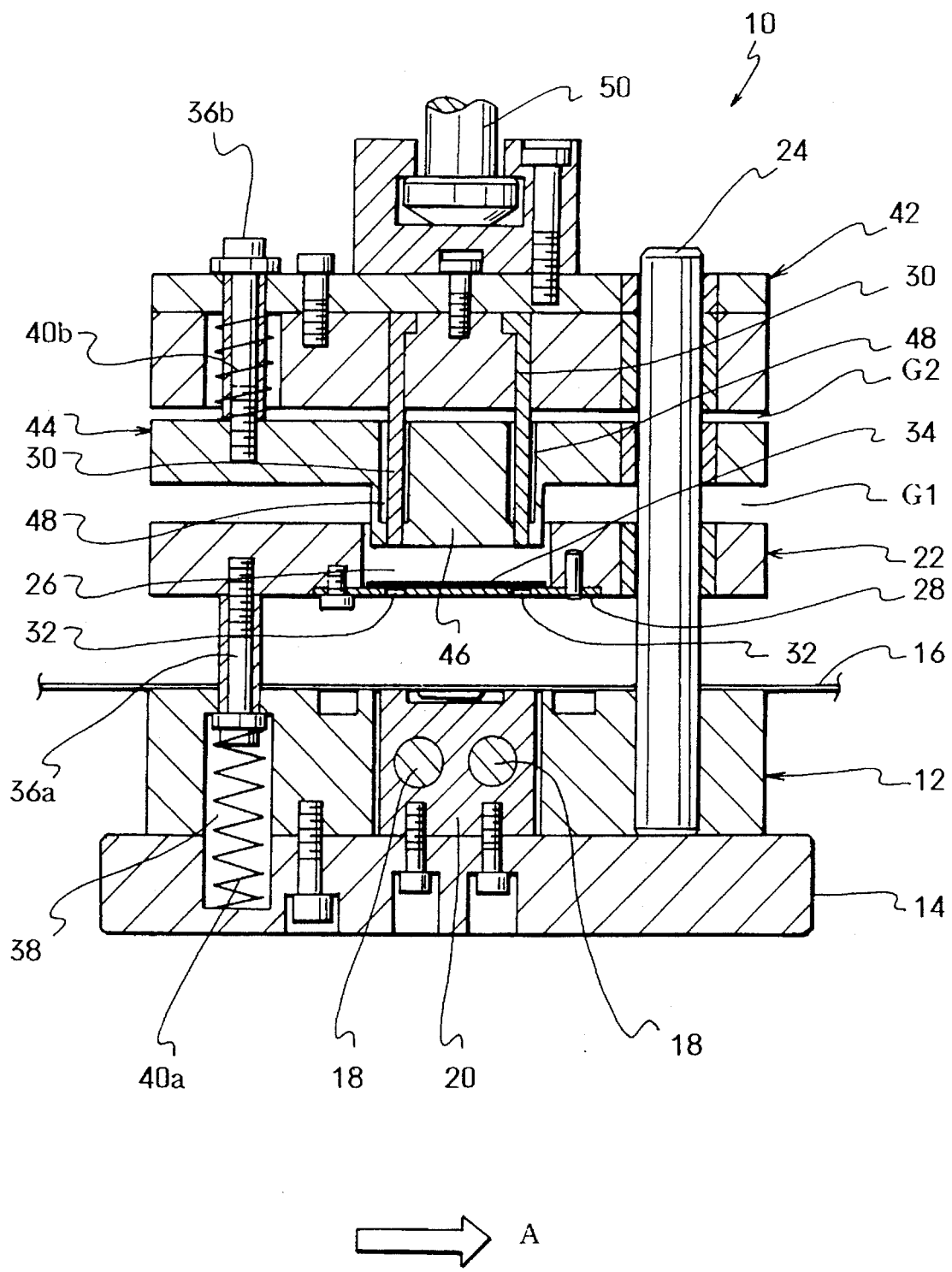
FIG. 1 is a partial front view of a lead frame taping machine of the present invention.

Preferred embodiments of the present invention will now be described in detail with reference to the accompanying drawings. In the present embodiment, a lead frame taping machine which is capable of taping inner leads of lead frames for semiconductor devices will be explained.

At the outset, the structure of the machine 10 will be explained with reference to FIG. 1.

A lead frame holding section 12 is fixed on a base section 14. An upper face of the lead frame holding section 14 is horizontally formed, and a band-formed lead frame 16, which will be taped, is fed and held on the upper face thereof. There is fixed a heat unit 20, which includes heaters 18, in the lead frame holding section 12. The heat unit 20 is capable of heating the lead frame 16 so as to hasten the adhesives of a tape 34, which will be taped onto the lead frame 16, to melt for providing effective taping.

A die plate 22 is horizontally provided above the lead frame holding section 12. The die plate 22 slidably covers guide posts 24, which are set up on the base section 14, so that the die plate 22 is capable of vertically moving along the guide posts 24. A die 28 is fixed on a bottom face of the die plate 22. The die 28 is arranged to correspond to a center hole 26 of the die plate 22. Vertically bored through punch-holes 32 are provided through which punches 30 are capable of passing in the die 28. In the present embodiment, the clearance between an outer circumferential face of each punch 30 and an inner face of each through punch-hole 32 is made as small as possible, so that the through punch-holes 32 is capable of guiding the vertical movement of the punches 30. The tape 34 to be punched by the punches 30 is fed in the direction perpendicular to the surface of FIG. 1, and the tape 34 fed to the die 28 is held on an upper face thereof.

The die plate 22 is connected to the lead frame holding section 12 by bolts 36a. End sections of the bolts 36a are in spaces 38, which are formed between the lead frame holding section 12 and the base section 14. Springs 40a or biasing members are provided in each space 38 for always biasing, the bolts 36a upward. By the springs 40a, the die plate 22 locates at an uppermost position or a first position (see FIG. 1) when no force works on the die plate 22; the die plate 22 moves to a lowermost position or a second position (see FIG. 3) when the lead frame 16 is taped.

A punch plate 42 is horizontally provided. The punch plate 42 slidably covers the guide posts 24, so that the punch plate 42 is capable of vertically moving along the guide posts 24. Upper end sections of the punch 30 are fixed in the punch plate 42. Lower end sections of the punches 30 project from a bottom face of the punch plate 42 downward. With this structure, the punches 30 are vertically moved together with the punch plate 42, and the lower ends of the punches 30 are capable of moving to and away from the lead frame holding section 12 with the movement of the punch plate 42. Moving toward the lead frame holding sectin 12, the punches 30 punch the tape 34, which has been held on the die 28, pass through the through punch-holes 32 together with tape-chips, which are punched off from the tape 34, and press the tape-chips onto the upper face of the lead frame 16.

An intermediate plate 44 is horizontally provided between the die plate 22 and the punch plate 42. The intermediate plate 44 slidably covers the guide posts 24, so that the intermediate plate 44 is capable of vertically moving along the guide posts 24. The intermediate plate 44 is connected to the punch plate 42 by bolts 36b. There is formed a convex section 46, which projects downward, at the center portion of the intermediate plate 44. The convex section 46 is inserted in the center hole 26 of the die plate 22. With this structure, the intermediate plate 44 is vertically moved together with the punch plate 42, and a bottom face of the convex section 46 presses the tape 34 onto the upper face of the die 28 when the punches 30 punch the tape 34. Vertically bored through guide-holes 48 are provided, through which the lower parts of the punches 30 are inserted, in the intermediate plate 30. With this structure, the vertical movement of the punches 30 is guided by the through punch-holes 32 and the through guide-holes 48. The intermediate plate 44 is always biased downward by springs 40b, which is elastically provided between the intermediate plate 44 and the punch plate 42. Thus, when no force works on the punch plate 42, a gap G1 exists between the intermediate plate 44 and the die plate 22; and a gap G2 exists between the intermediate plate 44 and the punch plate 42, Note that, the elasticity of the springs 40b is greater than that of the springs 40a. And the size of the gap G2 is greater than the sum of the thickness of the die 28 and that of the tape 34.

A shank 50 is a part of a driving mechanism for vertically moving the punch plate 42. A lower end section of the shank 50 is connected to an upper part of the punch plate 42. The shank 50 is vertically moved by a known mechanism, e.g., Japanese Patent Kokai Gazette No. 2-25227, so that the punch plate 42, the punches 30 and the intermediate plate 44 can be vertically moved together. The pressing force given by the shank 50 can be set by, for example, controlling the vertical position of the shank 50.

Successively, the action of the lead frame taping machine 10 will be explained with further reference to FIGS. 2–5.

The state shown in FIG. 1 is a stand-by state in which no force works on the punch plate 42, etc.. In the state, the punch plate 42, the punches 30 and the intermediate plate 44 are located at uppermost positions; the die plate 22 is located at the first position. The lead frame 10 is fed onto the lead frame holding section 12 in the direction of the arrow A; the tape 34 is fed onto the die 28 in the direction perpendicular to the surface of FIG. 1.

Firstly, the driving mechanism including the shank 50 starts to move the shank 50 downward, so that the punch plate 42, the punches 30 and the intermediate plate 44 are moved downward together. By the movement, the convex section 46 of the intermediate plate 44, in which the lower end sections of the punches 30 have been Inserted in the through guide-holes 48, comes into the center hole 26 of the die plate 22, so that the bottom face of the convex section 46 presses the tape 34 unto the upper face of the die 28. During the movement, the bottom face of the intermediate plate 44 comes into contact with the upper face of the die plate 22, so that the gap G1 becomes zero (see FIG. 2).

The shank 50 is further moved downward against the elasticity of the springs 40a, then the die plate 22 is moved downward, so that the die plate 22 reaches the second position and the bottom face thereof presses the lead frame 16 onto the upper face of the lead frame holding section 12 (see FIG. 3).

In the state shown in FIG. 3, the shank 50 is further moved downward, so that the punch plate 42 is moved downward against the elasticity of the springs 40b and the gap G2 becomes almost zero. During the movement, the position of the intermediate plate 44 is fixed; the punches 30 are moved downward together with the punch plate 42 so that the lower end sections of the punches 30 project from the bottom face of the convex section 46. By the projections, the punches 30 punch off the tape 34, pass the through punch-holes 32 and press the tape-chips 34a, which have been stuck on the lower end faces of the punches 30, onto the upper face of the lead frame 16 (see FIG. 4).

When the tape-chips 34a are pressed onto the lead frame 16, the lead frame 16 is heated by the heating unit 20, so that the adhesive on bottom faces of the tape-chips 34a are melted and the tape-chips 34a are efficiently taped on the upper face of the lead frame 16. After the tape-chips 34a have been taped thereon, the driving mechanism begins to move the shark 50 upward. During the movement, the force biasing the punch plate 42, the punches 30, the intermediate plate 44 and the die plate 22 downward is released in order, so that they are returned to the stand-by state by the springs 40a and 40b (see FIG. 5).

In the present embodiment, the die plate 22 is capable of moving to and away from the lead frame 16 and the lead frame holding section 12. The die plate 22 locates at the first position, which is the farthest position from the lead frame 16 and the lead frame holding section 12, when no force works on the die plate 22, etc.. Namely, the die plate 22 and the die 28 are located at the farthest positions from the lead frame 16, so that the tape 34 can be maintained without having any heat applied in the stand-by state. Thus, excessive softening of the adhesive on the tape 34 can be prevented.

And when the punches 30 punch the tape 34 and presses the tape-chips 34a onto the lead frame 16, the die plate 22 is moved to the second position, which is the nearest positon with respect to the lead frame 16 and the lead frame holding section 12, so that the punches are moved toward the lead frame 16 via the through guide holes 48 and the through punch-holes 32, which have been close to the lead frame 16. Thus, the movement of the punches 30 can be guided until their stroke ends, so that the accuracy of the taping position of the tape-chips 34a can be highly raised.

Particularly, as described above, the clearance between each outer circumferential face of the punches 30 and each inner face of the through punch-holes 32 is designed as small as possible, so the through punch-holes 32 role as means for guiding the vertical movement of the punches 30, so that the accuracy of the taping position of the tape-chips 34a can be increased. Even if the adhesive of the tape-chips 34a is excessively melted and the tape-chips 34a are apt to slide by the pressing force, the through punch-holes 32 prevent the tape-chips 34a from sliding on the lead frame 16.

And in the present embodiment, since the die 28 presses the lead frame 16 onto the lead frame holding section 12, undesirable transforming of the inner leads of the lead frame 16, e.g., bending, twisting, can be prevented while taping. Thus, said taping position of the tape-chips 34a can be raised.

Furthermore, since the die plate 22 returns to the second position after taping the tape-chips 34a, the tape 34 can be prevented from having any effects.

Next, a lead frame feeding mechanism, which is capable of feeding the lead frame 16 to the lead frame taping machine 10 will be explained with reference to FIGS. 6 and 7. Note that, elements which are already shown in FIGS. 1–5 are assigned the same symbols and explanation will be omitted.

In the case of continuously taping of the lead frame 16, an IC-mounting section 60, which is formed on the bottom face of the lead frame 16, is set in a concave section 62, which is formed on the upper face of the lead frame holding section 12, when the taping work is executed. Upon completing the taping, the IC-mounting section 60 is taken out from the concave section 62 to feed the lead frame 16 in the direction of the arrow A. Note that, the tape 34 is fed in the direction of an arrow B perpendicular to the direction of the arrow A.

Both longitudinal edges of the lead frame 16 are held by a pair of feed plates 64, which is capable of vertically moving. Each feed plate 64 has a shaft 66, which is covered with a spring 40c for always biasing the feed plate 64 downward. The shaft 66 is pushed upward by lifting a rod 68 in the direction of an arrow H. The rod 68 is driven by a lifting mechanism (not shown). In FIG. 7, a state in which the feed plates 64 and the lead frame 16 are at the lowermost positions and the taping work can be executed is shown on an arrow F side with respect to a center line E; a state in which the feed plates 64 and the lead frame 16 are at the uppermost positions and the lead frame 16 can be fed is shown by an arrow G side with respect to the center line E.

Positioning pins 70a for defining the position of the lead frame 16 on the lead frame holding section 12 are vertically fixed in the lead frame holding section 12. When the feed plates 64 move downward, the positioning pins 70a pass through through-holes 72 and come into guide holes (not shown) of the lead frame 16 so as to define the position thereof. And there are upwardly fixed positioning pins 70b in the die plate 22, and the positioning pins 70b come into the guide holes of the lead frame 16 so as to define the same when the die plate 22 moves downward.

In the above described embodiment, four tape-chips 34a, which are linearly punched off, are taped (see FIG. 6). Another punching form will be explained with reference to FIG. 8. Note that, elements which have already been shown in FIGS. 1–7 are assigned the same symbols and explanation will be omitted.

Figure 8:
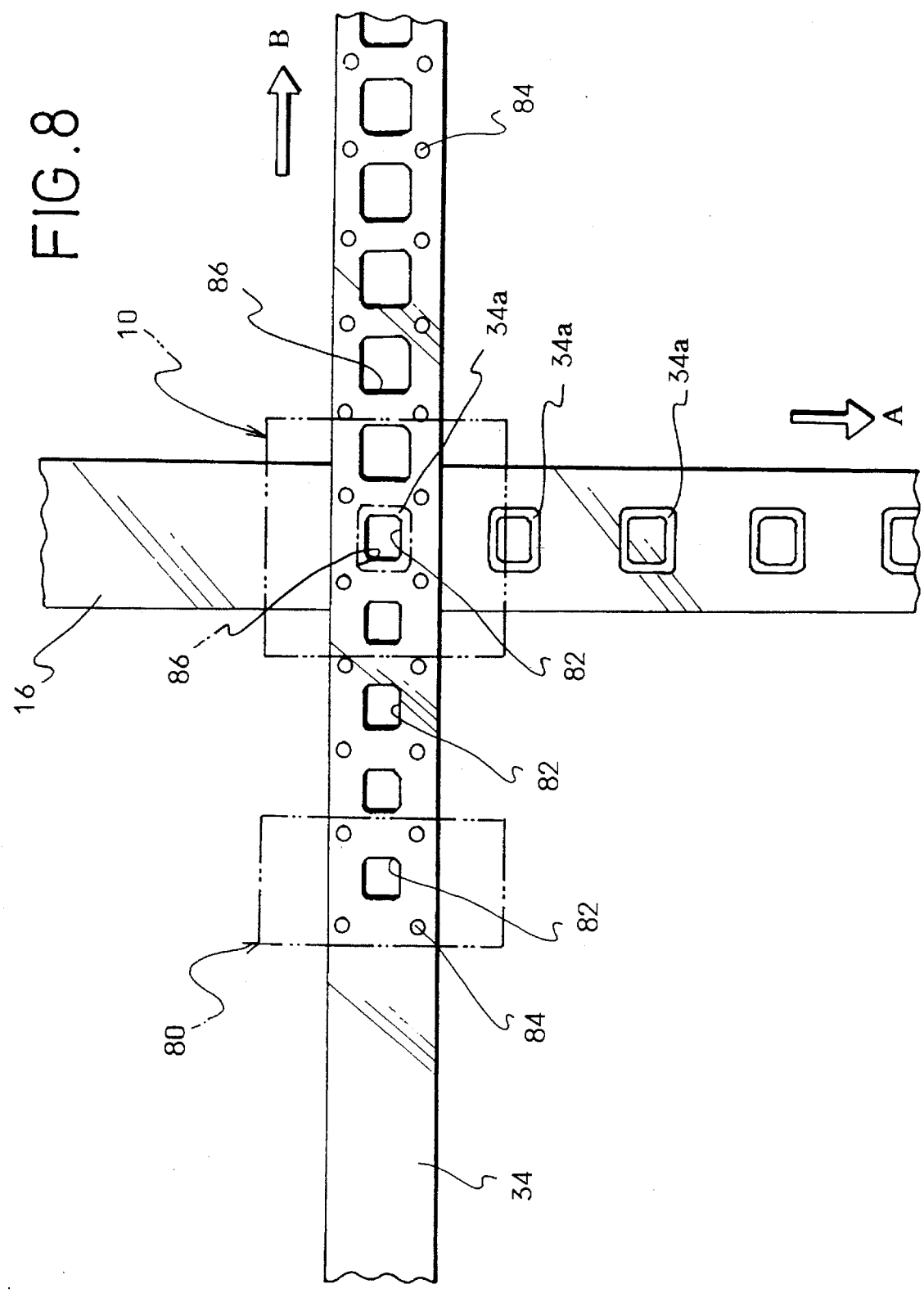
FIG. 8 is an explanation view showing another example of punching forms.

In an example shown in FIG. 8, the tape-chips 34a are punched off from the tape 34 in the form of rectangular frames and taped onto the lead frame 10.

The lead frame 16 is fed in the direction of the arrow A as well as the example shown in FIG. 6; the tape 34 is fed in the direction of the arrow B perpendicular to the direction of the arrow A. The tape 34 is punched so as to bore first holes 82 and pilot holes 84 by a known press machine 80, which has punches and dies, before reaching the lead frame taping machine 10.

The tape 34, which has the first holes 82 and the pilot holes 84 is further fed in the direction of the arrow B, so that the tape 34 reaches the lead frame taping machine 10. The lead frame taping machine 10 has a die and a punch for punching second holes 86, which is bigger than the first holes 82, and other elements shown in FIGS. 1–7. The second holes 86 are punched outer side of the first holes 52, so that the tape-chips 34a having the rectangular frame shape are punched off from the tape 34 and taped onto the lead frame 16.

Successively, another embodiment of the lead frame taping machine will be explained with reference to FIG. 9. Note that, elements which have already been shown in FIGS. 1–8 are assigned the same symbols and explanation will be omitted.

In the former embodiment, the die plate 22 which locates at the second position presses the lead frame 16 onto the lead frame holding section 12. In the present embodiment shown in FIG. 9, there will be formed a gap between the bottom face of the die plate 22 locating at the second position and the upper face of the lead frame 16. To form the gap, for example, stoppers 90 are provided in the die plate 22. The stoppers 90 are capable of limiting the downward movement of the die plate 22 and defining the gap. In the embodiment shown in FIG. 9, the thickness of the stoppers 90 is designed, for example, almost five times as thick as that of the tape 34.

Figure 9:
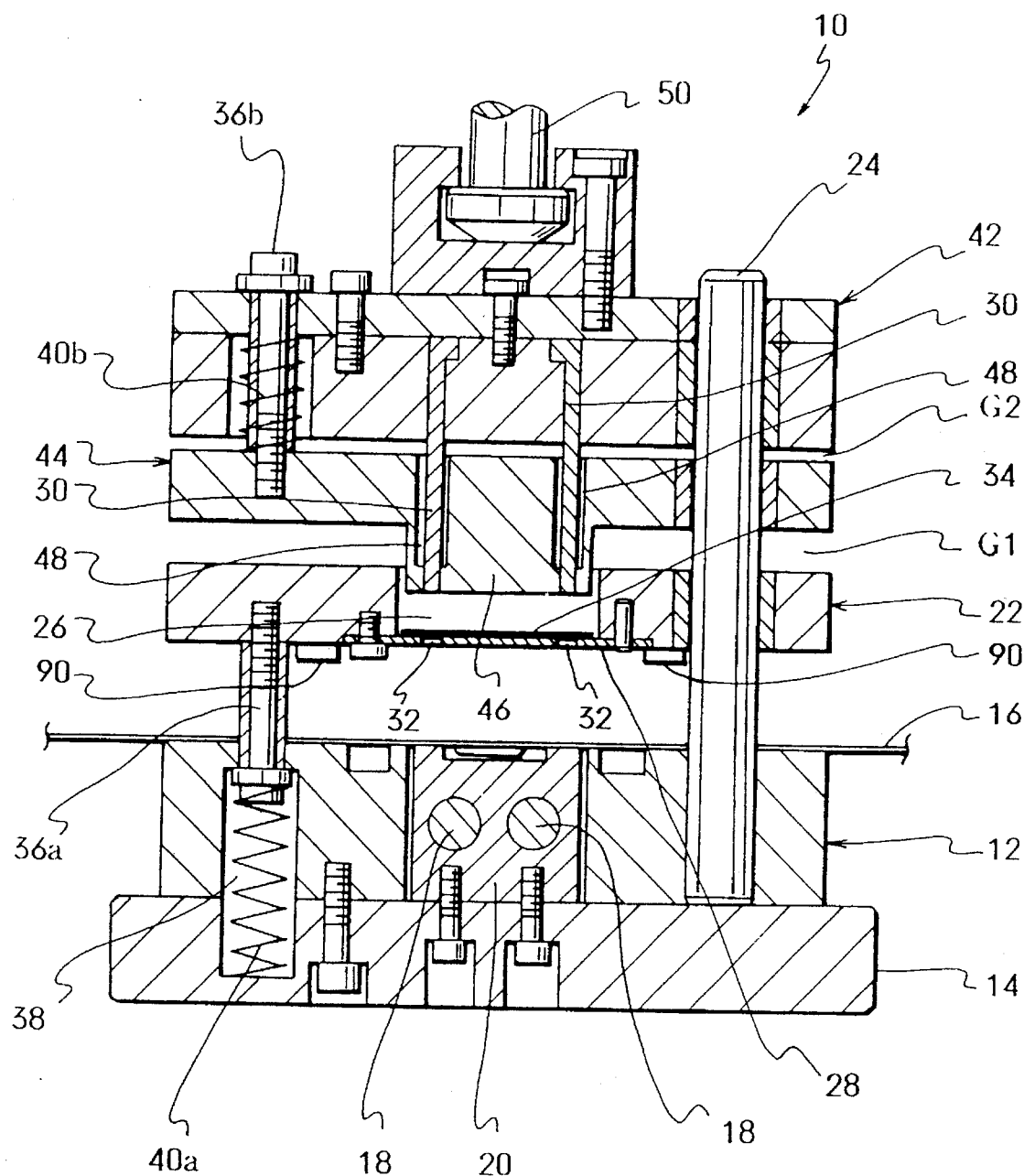
FIG. 9 is a partial front view of another embodiment.
Figure 10:
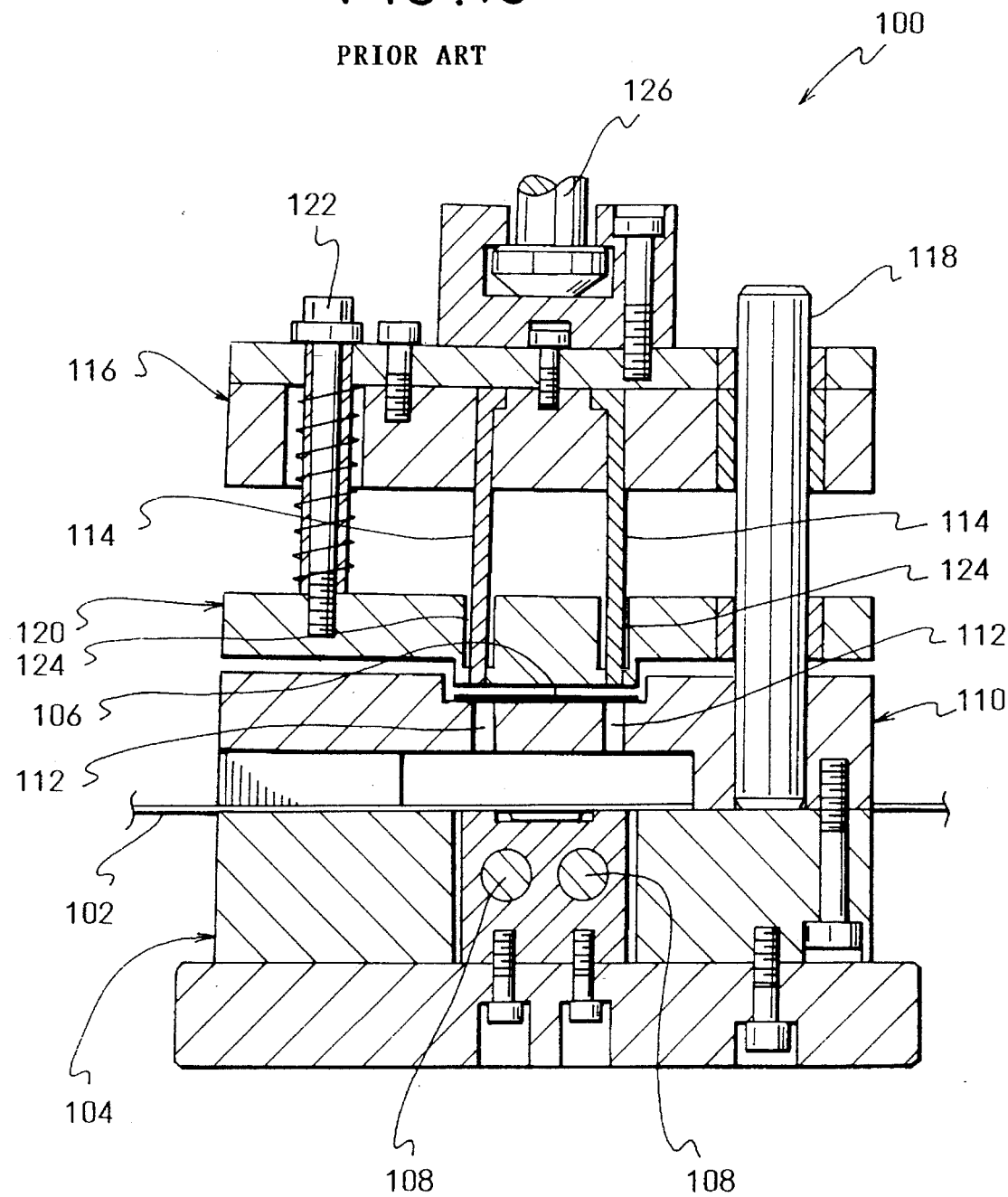
FIG. 10 is a partial front view of the conventional lead frame taping machine.

In the embodiment shown in FIG. 9, even if the die plate 22 locates at the second position, there is the gap between the bottom face of the die plate 22 and the upper face of the lead frame 16, so that the heat from the heaters 18 is prevented from directly conducting to the tape 34, so that the excessive softening of the adhesives of the tape 34 can be further prevented.

In the above described embodiments, the punch plate 42 presses the die plate 22 downward with the intermediate plate 44, the punch plate 42 may have proper means for directly pushing the die plate 22, e.g., a pusher.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A lead frame taping machine comprising:

a lead frame holding section for holding a lead frame;

a die plate for holding a tape to be punched, said die plate being provided away from said lead frame holding section and having a through punch-hole;

a punch being provided away from said die plate, said punch being capable of moving to and away from said lead frame holding section through said through punch-hole whereby said punch is capable of punching said tape and pressing a tape-chip, which is punched off from said tape, onto said lead frame; and a driving mechanism for moving said punch, characterized in that:

said die plate is capable of moving between a first position which is separate away from said lead frame holding section and a second position which is close thereto, said die plate is moved to the second position when said punch punches off said tape and presses said tape-chip onto said lead frame.

2. The lead frame taping machine according to claim 1, wherein said die plate is capable of pressing said tape onto said lead frame holding section at the second position.

3. The lead frame taping machine according to claim 1, wherein said punch is attached to a punch plate, which is moved by said driving mechanism, and which presses said die plate toward said lead frame holding section with the movement toward said die plate; and wherein said die plate is always biased toward the first position by a biasing member, said die plate moves to the second position when said punch plate is moved toward said die plate against the elasticity of said biasing member.

4. The lead frame taping machine according to claim 1, further comprising an intermediate plate being provided away from said die plate, said intermediate plate being moved together with said punch, said intermediate plate pressing said tape onto said die plate when said punch punches off said tape.

5. The lead frame taping machine according to claim 4, wherein said intermediate plate has a guide hole for guiding the movement of said punch, through which said punch passes.

6. A lead frame taping machine comprising:

a lead frame holding section for holding a lead frame on an upper face;

a die plate for holding a tape to be punched on an upper face, said die plate being provided above said lead frame holding section, said die plate having a through punch-hole, which is bored in the vertical direction;

a punch being provided above said die plate, said punch being capable of moving in the vertical direction and moving to and away from said lead frame holding section through said through punch-hole whereby said punch is capable of punching said tape and pressing a tape-chip, which has punched off from said tape, onto an upper face of said lead frame; and a driving mechanism for moving said punch in the vertical direction, characterized in that:

said die plate is capable of moving between a first position which is separate away from said lead frame holding section and a second position which is close thereto, said die plate is moved to the second position when said punch punches off said tape and presses said tape-chip onto said lead frame.

7. The lead frame taping machine according to claim 6, wherein said die plate is capable of pressing said tape onto said lead frame holding section at the second position.

8. The lead frame taping machine according to claim 6, wherein said punch is attached to a punch plate, which is moved in the vertical direction by said driving mechanism, and which presses said die plate downward by moving downward; and wherein said die plate is always biased toward the first position by a biasing member, said die plate moves to the second position when said punch plate is moved downward against the elasticity of said biasing member.

9. The lead frame taping machine according to claim 6, further comprising an intermediate plate being provided above said die plate, said intermediate plate being vertically moved together with said punch, said intermediate plate being capable of pressing said tape onto the upper face of said die plate when said punch punches off said tape.

10. The lead frame taping machine according to claim 9, wherein said intermediate plate has a guide hole for guiding the movement of said punch, through which said punch passes.

* * * * *